(12) United States Patent
Bonthron et al.

(10) Patent No.: US 10,587,255 B2
(45) Date of Patent: Mar. 10, 2020

(54) MULTI-LEVEL OUTPUT DRIVER WITH ADJUSTABLE PRE-DISTORTION CAPABILITY

(71) Applicant: Skorpios Technologies, Inc., Albuquerque, NM (US)

(72) Inventors: Andrew Bonthron, Los Angeles, CA (US); Phuoc Nguyen, Rosemead, CA (US); Viktor Novozhilov, San Pedro, CA (US); Michael Nilsson, Hermosa Beach, CA (US); Wei-Min Kuo, Redondo Beach, CA (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 15/655,654

(22) Filed: Jul. 20, 2017

(65) Prior Publication Data

US 2018/0069542 A1    Mar. 8, 2018

Related U.S. Application Data

(60) Provisional application No. 62/365,787, filed on Jul. 22, 2016.

(51) Int. Cl.
| | | |
|---|---|---|
| *H03K 7/02* | (2006.01) | |
| *H03K 19/00* | (2006.01) | |
| *H04B 14/02* | (2006.01) | |
| *H04L 25/49* | (2006.01) | |

(52) U.S. Cl.
CPC ............ *H03K 7/02* (2013.01); *H03K 19/0002* (2013.01); *H04B 14/023* (2013.01); *H04L 25/4917* (2013.01)

(58) Field of Classification Search
CPC ...... H03K 7/02; H03K 19/0002; H04L 25/49; H04L 25/4917; H04B 14/023
USPC .......................................................... 375/353
See application file for complete search history.

(56) References Cited

U.S. PATENT DOCUMENTS

| | | | |
|---|---|---|---|
| 8,432,219 | B1 | 4/2013 | Cook |
| 9,699,009 | B1 * | 7/2017 | Ainspan ............. H04L 25/4917 |
| 2006/0233278 | A1 | 10/2006 | Zerbe et al. |
| 2006/0242483 | A1 | 10/2006 | Werner et al. |
| 2010/0281089 | A1 * | 11/2010 | Vigoda .................. H04L 27/38 708/274 |
| 2015/0071651 | A1 | 3/2015 | Asmanis et al. |
| 2016/0013954 | A1 | 1/2016 | Shokrollahi et al. |

OTHER PUBLICATIONS

PCT/US2017/043265 filed Jul. 21, 2017 received an ISR/WO mailed Nov. 2, 2017, 15 pages.

* cited by examiner

*Primary Examiner* — Chieh M Fan
*Assistant Examiner* — Fitwi Y Hailegiorgis
(74) *Attorney, Agent, or Firm* — Kilpatrick Townsend & Stockton LLP

(57) ABSTRACT

A PAM (Pulse Amplitude Modulation) modulator driver is configured to receive a PAM input signal having N input amplitude levels and provide a PAM output signal having N output amplitude levels, where N is an integer. The PAM modulator driver circuit configured to electrically adjust amplitude levels in the PAM output signal.

20 Claims, 11 Drawing Sheets

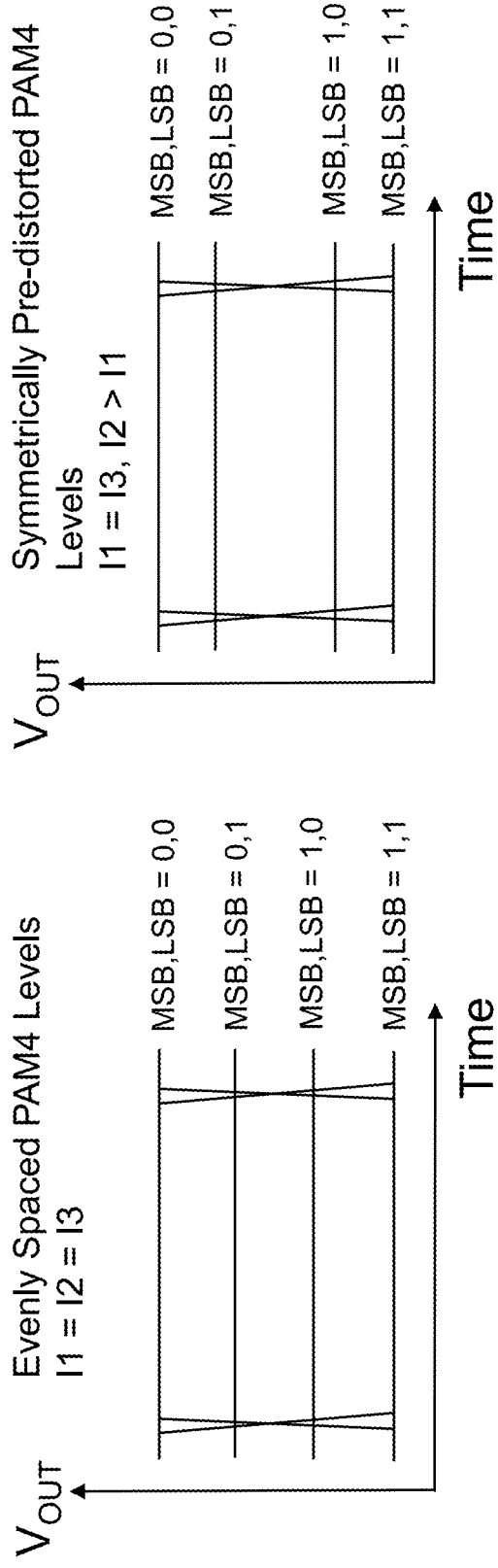
FIG. 7A Evenly Spaced PAM4 Levels I1 = I2 = I3
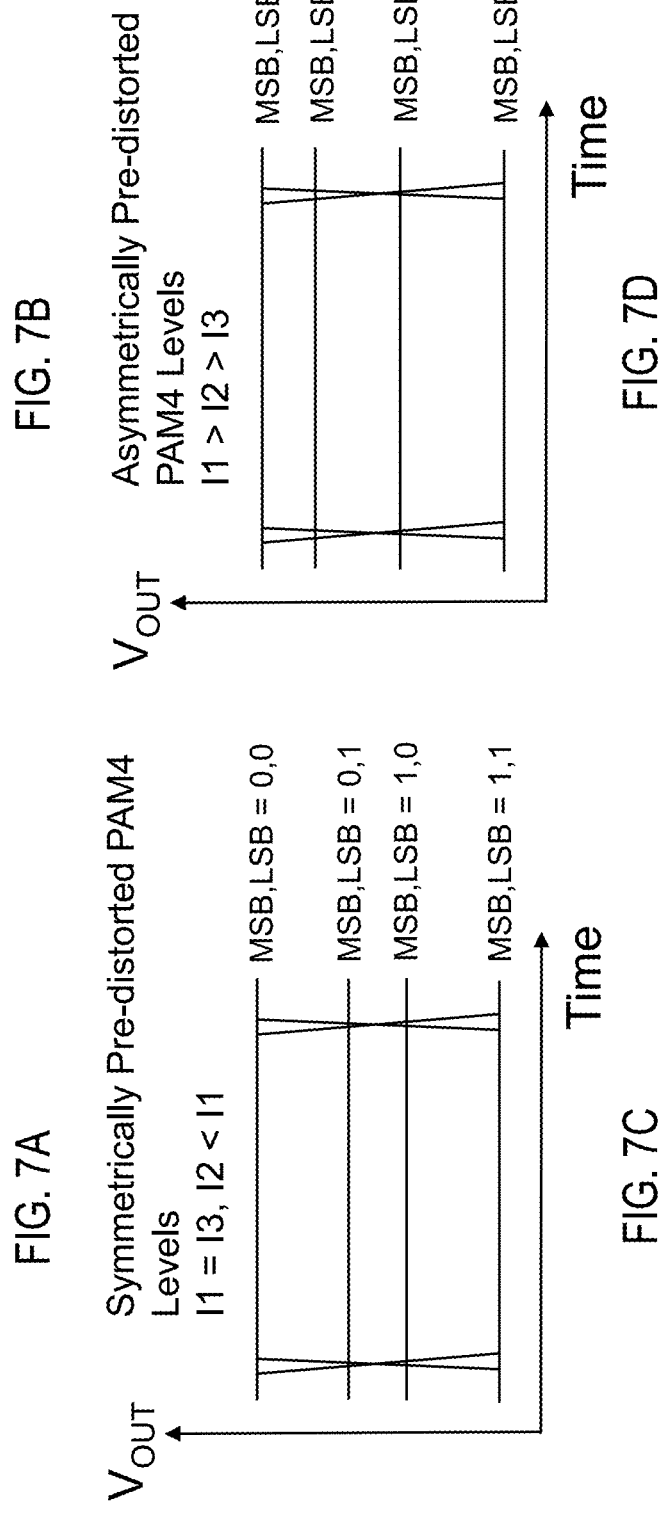
FIG. 7B Symmetrically Pre-distorted PAM4 Levels I1 = I3, I2 > I1
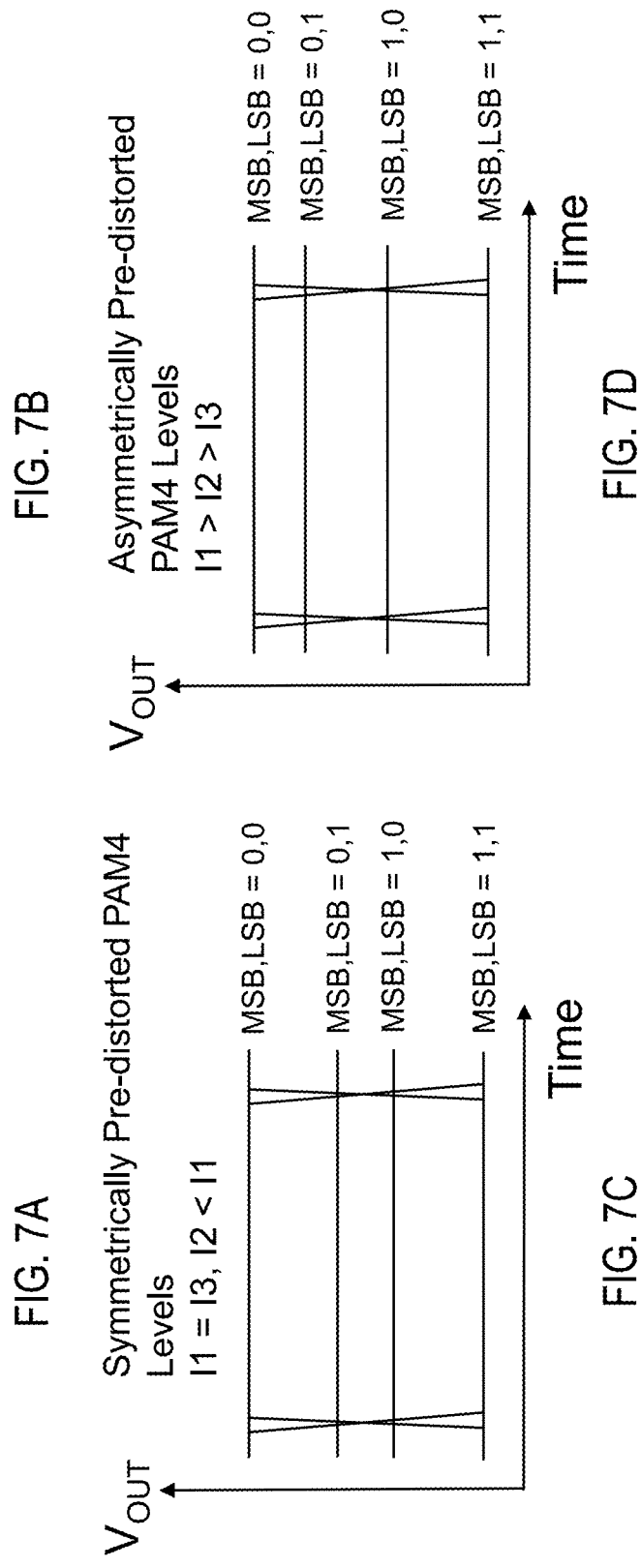
FIG. 7C Symmetrically Pre-distorted PAM4 Levels I1 = I3, I2 < I1
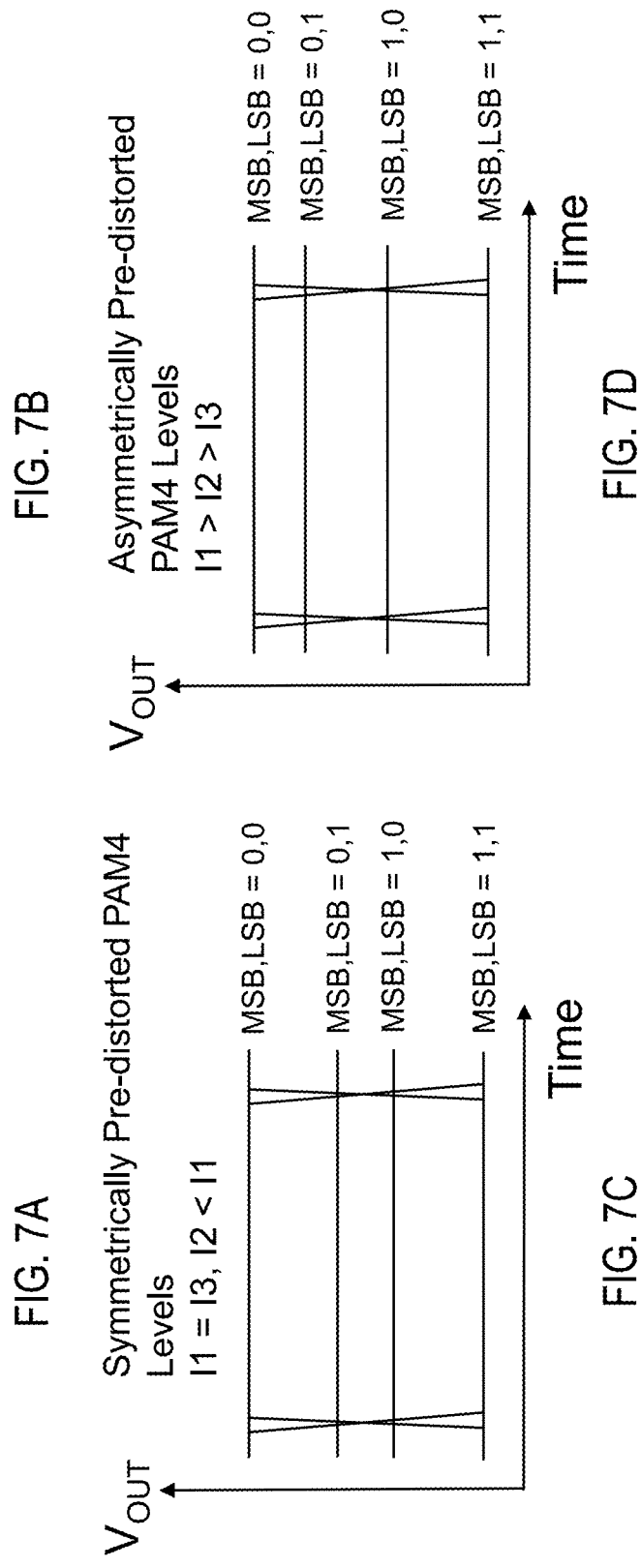
FIG. 7D Asymmetrically Pre-distorted PAM4 Levels I1 > I2 > I3

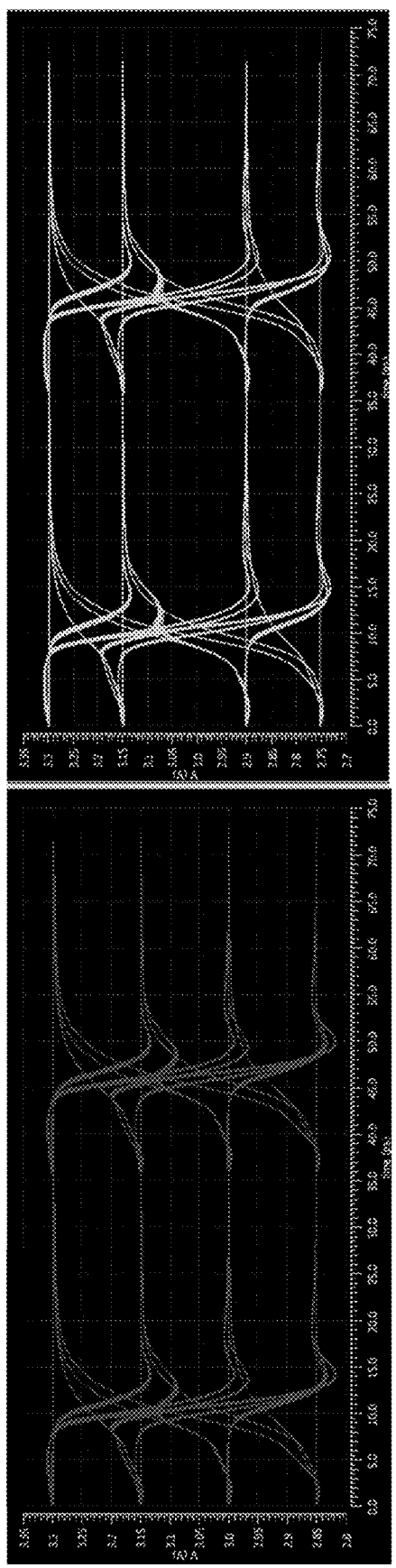
FIG. 8A
FIG. 8B
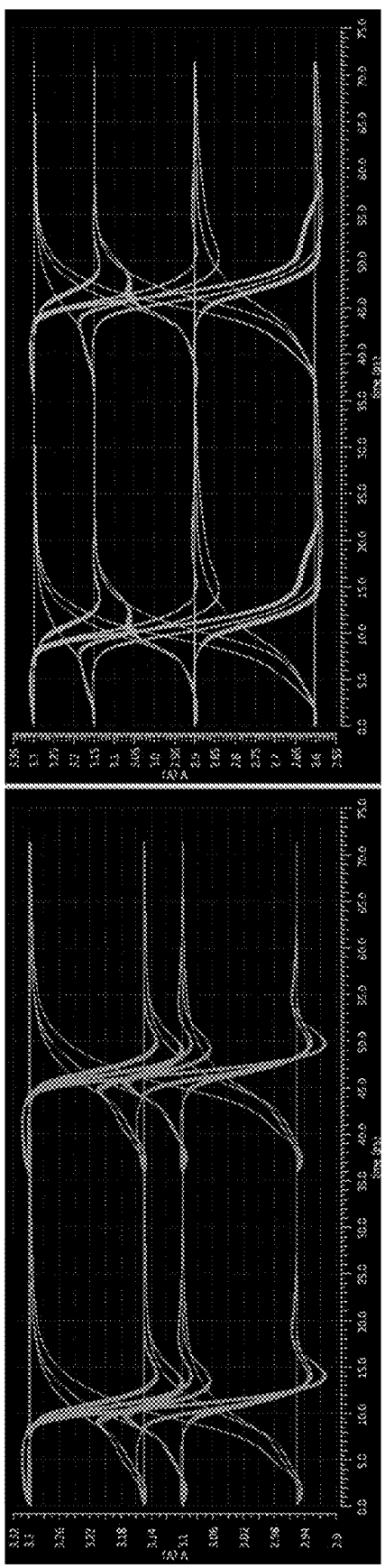
FIG. 8C
FIG. 8D

MULTI-LEVEL OUTPUT DRIVER WITH ADJUSTABLE PRE-DISTORTION CAPABILITY

CROSS-REFERENCES TO RELATED APPLICATIONS

This application claims priority to U.S. Provisional Patent Application No. 62/365,787, filed on Jul. 22, 2016, entitled "Multi-Level Output Driver With Adjustable Pre-Distortion Capability," the disclosure of which is hereby incorporated by reference in its entirety for all purposes.

BACKGROUND OF THE INVENTION

Embodiments of the present invention is directed to methods and apparatus for a signal modulator driver. Some embodiments of the invention are directed to methods and apparatus for realization of a PAM (Pulse Amplitude Modulation) modulator driver providing electrically adjustable pre-distortion of the PAM output waveform.

Pulse-amplitude modulation (PAM) is widely used in modulating signal transmission of digital data. For example, PAM4 (Pulse Amplitude Modulation-4) is a modulation technique in which four distinct pulse amplitudes are used to convey the information, as shown in FIG. 1. Four amplitude levels can be represented by two binary bits 00, 01, 11, and 10, respectively. Each pair of bits is called a symbol. When one of the four amplitudes is transmitted in a symbol period T, there are two bits transmitted in parallel, therefore the data rate is doubled. In other words, PAM-4 modulation is twice as bandwidth-efficient as conventional binary modulation.

Conventional PAM4 modulator driver architectures used commonly in the art utilize a highly linear wide band power amplifier to amplify a 4-level PAM4 input signal and provide a PAM4 output signal with sufficient amplitude to drive an optical modulator in a communications system with low harmonic distortion. The inventors have identified many drawbacks in the conventional approaches. For example, the conventional approach suffers from high power dissipation due to the requirement of providing high linearity and low distortion of the input signal. It also suffers from PAM4 output eye closure, overshoot, and undershoot due to the non-ideal amplitude and group delay response in the amplifier transfer characteristic, as well as rise and fall time degradation due to bandwidth limitations.

From the above, it is seen that techniques for improved PAM4 modulator driver are highly desired.

BRIEF SUMMARY OF THE INVENTION

The present invention is directed to method and apparatus for a PAM modulator driver. Some embodiments of the invention are directed to method and apparatus for realization of a PAM4 modulator driver providing electrically adjustable pre-distortion of the PAM4 output waveform. The electrically adjustable pre-distortion can be used for the purpose of counteracting non-linearity associated with the optical modulator in an optical communications system.

According to some embodiments of the present invention, a PAM4 (Pulse Amplitude Modulation-4) modulator driver circuit includes a PAM4-to-unary decoder configured to receive a PAM4 data signal and to convert the PAM4 data signal to a thermometer code signal, the thermometer code signal including three data bits. The PAM4 modulator driver circuit also includes a unary-to-PAM4 encoding driver coupled to the PAM4-to-unary decoder to receive the thermometer code signal, and to convert the thermometer code signal to a PAM4 output signal. The unary-to-PAM4 encoding driver includes three variable current sources and is configured to provide electrically adjustable signal levels in the PAM4 output signal. Depending on the embodiment, the PAM4 output signal can be a differential signal or a single-ended signal.

In some embodiments of the PAM4 modulator driver circuit, the unary-to-PAM4 encoding driver includes a first circuit including a first switch and a first adjustable current source and configured to receive a first data bit of the thermometer code signal, a second circuit including a second switch and a second adjustable current source and configured to receive a second data bit of the thermometer code signal, and a third circuit including a third switch and a third adjustable current source and configured to receive a third data bit of the thermometer code signal. The unary-to-PAM4 encoding driver also has a current summing buffer coupled to the first circuit, the second circuit, and the third circuit. A load circuit is coupled to the current summing buffer and configured to provide an output voltage signal based on a sum of current from each of the first, the second, and the third circuits. In some embodiments, the unary-to-PAM4 encoding driver also includes three current control signals for adjusting, respectively, the first adjustable current source, the second adjustable current source, and the third adjustable current source.

In some embodiments of the PAM4 modulator driver circuit, the PAM4 data signal includes two differential PAM4 data signals. In an embodiment, the PAM4-to-unary decoder includes a differential resistor ladder circuit to receive the two differential PAM4 data signals and to provide multiple internal signals. The PAM4-to-unary decoder also includes three differential comparators coupled to the differential resistor ladder circuit to receive the multiple internal signals, and the three differential comparators configured to provide the thermometer code signal.

In some embodiments, the differential resistor ladder circuit includes a first resistor ladder for receiving a first differential PAM4 signal. The first resistor ladder includes a first transistor, a first resistor, a second resistor, and a first current source coupled in series at, respectively, three internal nodes and configured to provide a first group of three voltage signals. The differential resistor ladder circuit also includes a second resistor ladder for receiving a second differential PAM4 signal. The second resistor ladder including a second transistor, a third resistor, a fourth resistor, and a second current source coupled in series at, respectively, three internal nodes and is configured to provide a second group of three voltage signals.

In some embodiments, each of the three differential comparators comprises two input terminals for receiving a first signal from one of the first group of three voltage signals of the first resistor ladder, and a second signal from one of the second group of three voltage signals of the second resistor ladder. Each differential comparator is configured to compare the first signal and the second signal to provide differential output signals representing one of three data bits of the thermometer code signal.

According to some embodiments of the present invention, A PAM (Pulse Amplitude Modulation) modulator driver circuit includes a PAM-to-unary decoder configured to receive a PAM input signal and convert the PAM input signal to a unary code signal. The PAM modulator driver circuit also has a unitary-to-PAM encoding driver coupled to the PAM-to-unary decoder and configured to convert the unary code signal to a PAM output signal. In some embodiments, the PAM modulator driver circuit is configured to electrically adjust amplitude levels in the PAM output signal.

In some embodiments, the PAM input signal has N amplitude levels, the unary code signal has N−1 data bits, and the PAM output signal has N amplitude levels, where N is an integer. The unitary-to-PAM encoding driver includes N−1 current sources. Each of the current sources is controlled by one of the data bits in the unary code signal.

In some embodiments, the N−1 current sources are adjustable current sources configured to provide current levels adjustable by a respective control signal. The adjustable current sources are configured to electrically adjust amplitude levels in the PAM output signal.

In some embodiments, the PAM modulator driver circuit is a PAM4 (Pulse Amplitude Modulation-4) modulator driver circuit. The PAM4 modulator driver circuit includes a PAM4-to-unary decoder configured to receive a PAM4 data signal and to convert the PAM4 data signal to a thermometer code signal having three data bits. The PAM4 modulator driver circuit also includes a unary-to-PAM4 encoding driver coupled to the PAM4-to-unary decoder to receive the thermometer code signal, and to convert the thermometer code signal to a PAM4 output signal. The unary-to-PAM4 encoding driver includes three variable current sources and is configured to provide electrically adjustable signal levels in the PAM4 output signal.

According to some embodiments of the present invention, a PAM (Pulse Amplitude Modulation) modulator driver is configured to receive a PAM input signal having N input amplitude levels, where N is an integer, and provide a PAM output signal having N output amplitude levels. The PAM modulator driver includes a plurality of adjustable current sources configured to provide adjustable currents for electrically adjusting amplitude levels in the PAM output signal. In some embodiments of the above PAM modulator driver, $N=2^K$, where K is an integer.

In some embodiments, the PAM modulator driver includes a PAM-to-binary decoder configured to receive a PAM input signal and to convert the PAM input signal to a binary code signal, and a binary-to-PAM encoding driver coupled to the PAM-to-binary decoder and configured to convert the binary code signal to a PAM output signal. The PAM modulator driver is configured to provide electrically adjustable amplitude levels in the PAM output signal. In some embodiments, the plurality of adjustable current sources is configured to provide currents having binary weighted amplitudes.

In some embodiments, the PAM modulator driver includes a PAM-to-unary decoder configured to receive a PAM input signal and to convert the PAM input signal to a unary code signal, and a unary-to-PAM encoding driver coupled to the PAM-to-unary decoder and configured to convert the unary code signal to a PAM output signal. The PAM modulator driver is configured to provide electrically adjustable amplitude levels in the PAM output signal. In some embodiments, the plurality of adjustable current sources is configured to provide currents having equal amplitude.

According to some embodiments of the present invention, a decoder for converting a multi-level signal to digital signal is provides. Each digital signal has a number of data bits, and each data bit represent one of two data values. The multi-level signal to digital signal decoder includes a resistor ladder circuit to receive the multi-level signal and to provide multiple internal signals. The multi-level signal to digital signal decoder also include a plurality of comparators coupled to the resistor ladder circuit to receive the multiple internal signals, and is configured to provide the digital signal. In some embodiments, the resistor ladder circuit includes a first transistor, a number of resistors, and a first current source coupled in series at, respectively, multiple internal nodes and configured to provide multiple voltage signals.

A further understanding of the nature and advantages of the present invention may be realized by reference to the remaining portions of the specification and the drawings.

BRIEF DESCRIPTION OF THE DRAWINGS

FIGS. 7A-7D are PAM4 eye diagrams illustrating pre-distortion adjustment characteristics that can be generated on the PAM4 output signal according to an embodiment of the present invention;

FIGS. 8A-8D illustrate simulation waveforms showing the pre-distortion character described above in connection with FIG. 7 according to an embodiment of the present invention;

DETAILED DESCRIPTION OF THE INVENTION

Figure 1:
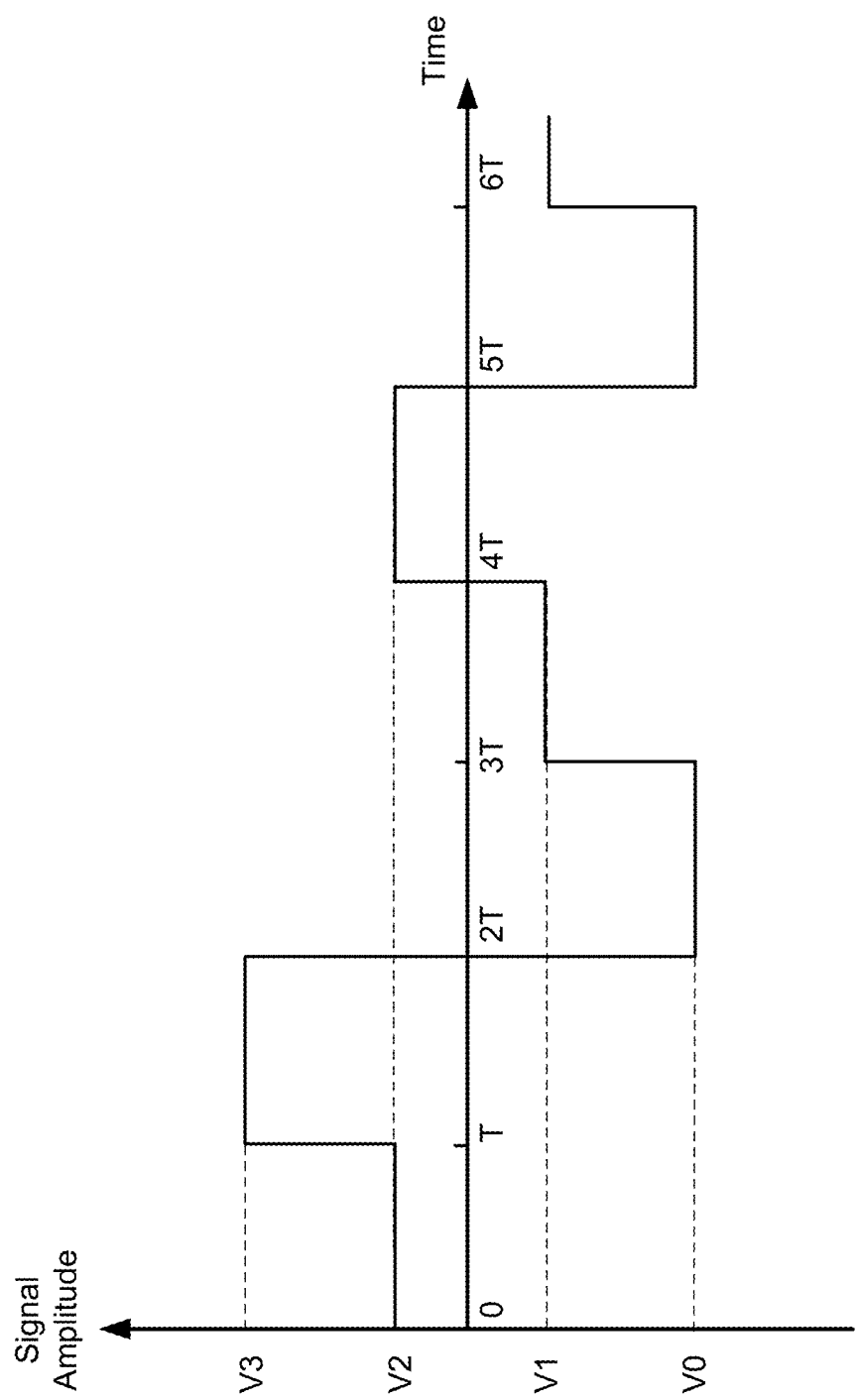
FIG. 1 is a waveform diagram illustrating an example of a PAM4 signal waveform.

Some embodiments of the present invention are directed to method and apparatus for a PAM (Pulse Amplitude Modulation) modulator driver providing signal amplification and electrically adjustable pre-distortion of the PAM output waveform.

In some embodiments, a PAM modulator driver is configured to receive a PAM input signal having N input amplitude levels, where N is an integer. The PAM modulator driver is also configured to provide a PAM output signal having N output amplitude levels. The PAM modulator driver can include a plurality of adjustable current sources configured to provide adjustable currents for electrically adjusting amplitude levels in the PAM output signal. The electrically adjustable pre-distortion can be used for the purpose of counteracting non-linearity associated with the optical modulator in an optical communications system.

Embodiments of the present invention provide benefits over the aforementioned problems associated with conventional approaches through the novel combination of non-linear decoder and encoder blocks to generate an output PAM waveform, which provides lower power dissipation than conventional linear approaches. Embodiments of the invention offer further benefits of providing a limiting amplifier function which provides low output eye overshoot and undershoot characteristics as well as fast rise and fall times. The embodiments further implement a pre-distortion capability for the output waveform for the purpose of counteracting non-linearity associated with the optical modulator in an optical communications system.

In some embodiments, the PAM modulator driver can include a PAM-to-binary decoder configured to receive a PAM input signal and to convert the PAM input signal to a binary code signal. The PAM modulator driver can also have a binary-to-PAM encoding driver coupled to the PAM-to-binary decoder and configured to convert the binary code signal to a PAM output signal. The PAM modulator driver is configured to provide electrically adjustable amplitude levels in the PAM output signal.

In some alternative embodiments, the PAM modulator driver can include a PAM-to-unary decoder configured to receive a PAM input signal and to convert the PAM input signal to a unary code signal. The PAM modulator driver can also have a unary-to-PAM encoding driver coupled to the PAM-to-unary decoder and configured to convert the unary code signal to a PAM output signal. The PAM modulator driver is configured to provide electrically adjustable amplitude levels in the PAM output signal. In these embodiments, the data bits in the unary code signal are used to control the adjustable current sources for electrically adjusting amplitude levels in the PAM output signal.

In embodiments where the PAM signal is converted to binary code signals, the data bits in the binary code signal are used to control the adjustable current sources for electrically adjusting amplitude levels in the PAM output signal. In embodiments where the PAM signal is converted to unary code signal, the data bits in the unary code signal are used to control the adjustable current sources for electrically adjusting amplitude levels in the PAM output signal. In the following description, example implementations are illustrated using PAM4 signals and unary code conversion. However, it is understood that the techniques can be applicable to other PAM signals, such as PAM8, PAM16, etc., and to binary code conversions as well.

Figure 2:
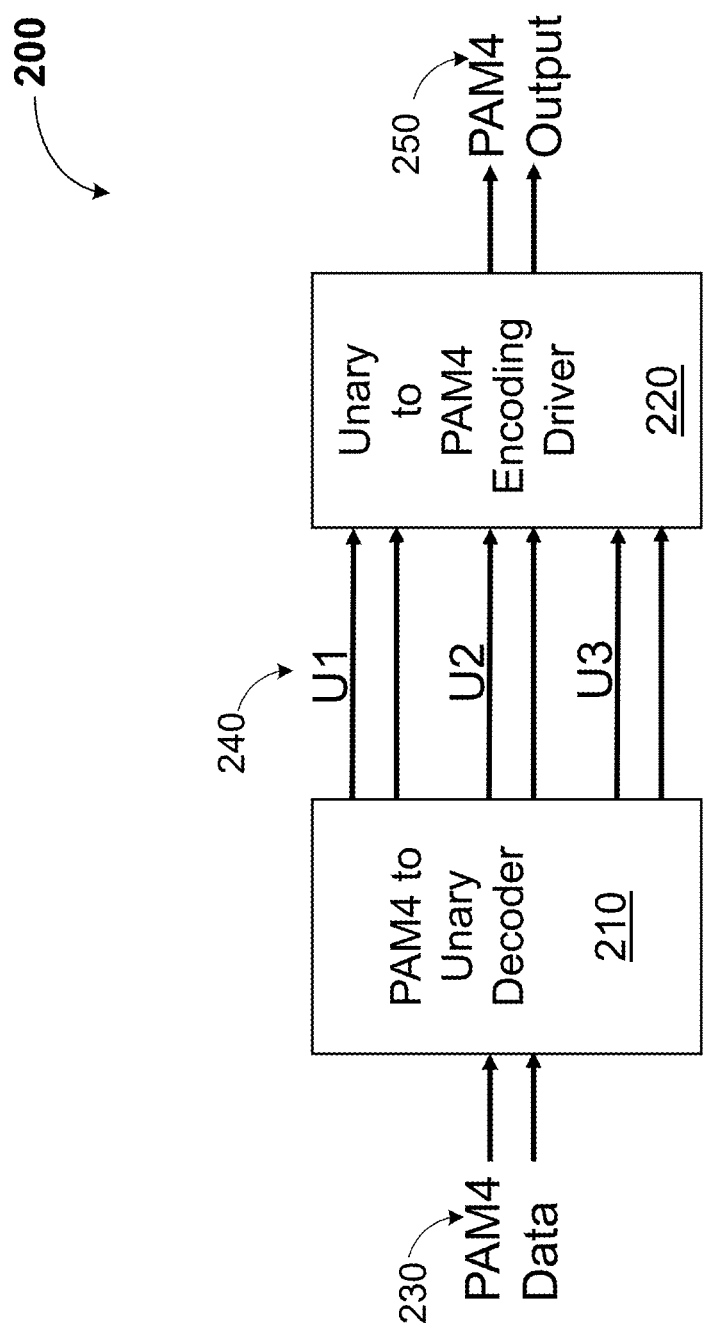
FIG. 2 is a simplified block diagram illustrating a system and method in which a PAM4 output waveform with large amplitude swing is generated according to an embodiment of the present invention.

FIG. 2 is a simplified block diagram illustrating a system and method in which a PAM4 output waveform with large amplitude swing is generated according to an embodiment of the present invention. As shown in FIG. 2, system 200 includes a PAM4-to-Unary Decoder 210 and a Unary-to-PAM4 Encoding Driver 220. A PAM4 (4-state) input waveform 230 is first decomposed into three unary NRZ (Non-Return to Zero) 2-state waveforms U1, U2, and U3 (240) using thermometer coding in PAM4-to-Unary Decoder 210. The resultant three unary NRZ waveforms 240 are then amplified and summed to create a high-swing PAM4 output waveform 250 in Unary-to-PAM4 Encoding Driver 220.

Figures 3A, 3B:
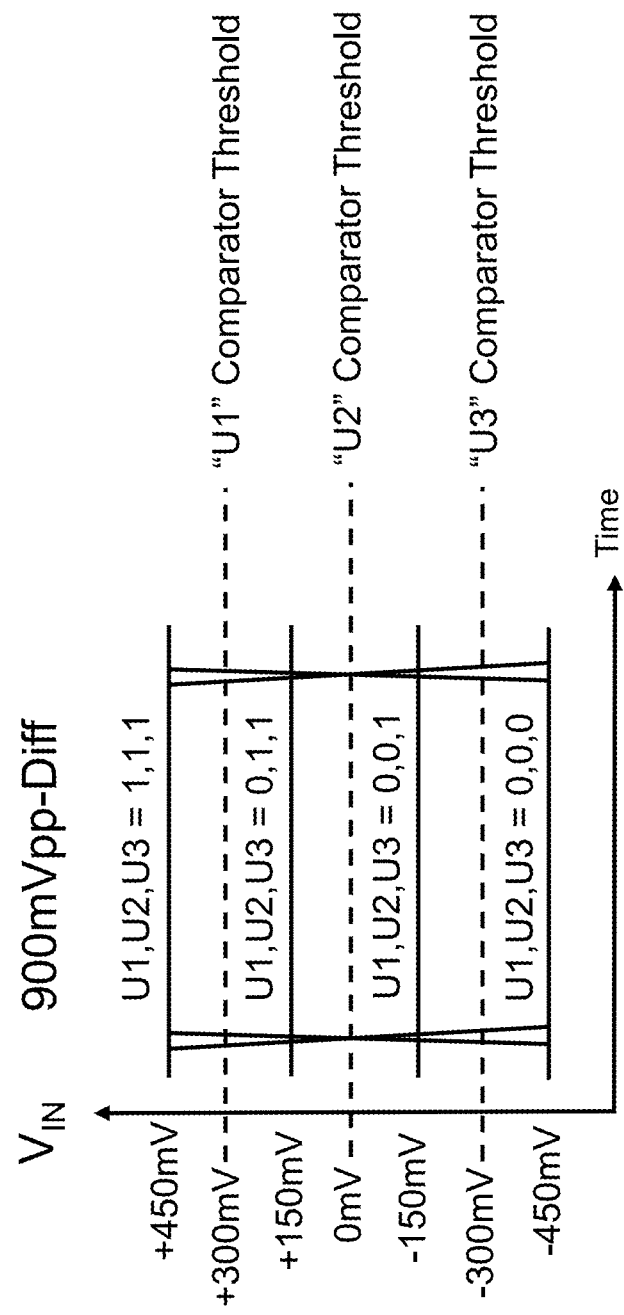
FIGS. 3A and 3B illustrate the conversion from a PAM4 signal to a unary code signal.

FIGS. 3A and 3B illustrate the conversion from a PAM4 signal to a unary code signal. FIG. 3A shows that a PAM4 signal having four signal amplitude levels V0, V1, V2, and V3 are converted to unary code signals U1, U2, and U3, in this case a thermometer code signal. It can be seen that V0 is converted to 000, V1 is converted to 001, V2 is converted to 011, and V3 is converted to 111. FIG. 3B shows an example with specific signal levels. It can be seen in FIG. 3B that a PAM4 input signal Vin is a differential signal with 900 mV peak-to-peak amplitude range. The fours signal levels in the PAM4 signal has signal amplitudes at −450 mV, −150 mV, +150 mV, and +450 mV. Three comparator thresholds are shown for U1, U2, and U3, respectively, at _300 mV, 0 mV, and −300 mV. FIG. 3B also shows that it can be seen that V0 is converted to 000, V1 is converted to 001, V2 is converted to 011, and V3 is converted to 111.

Figure 4:
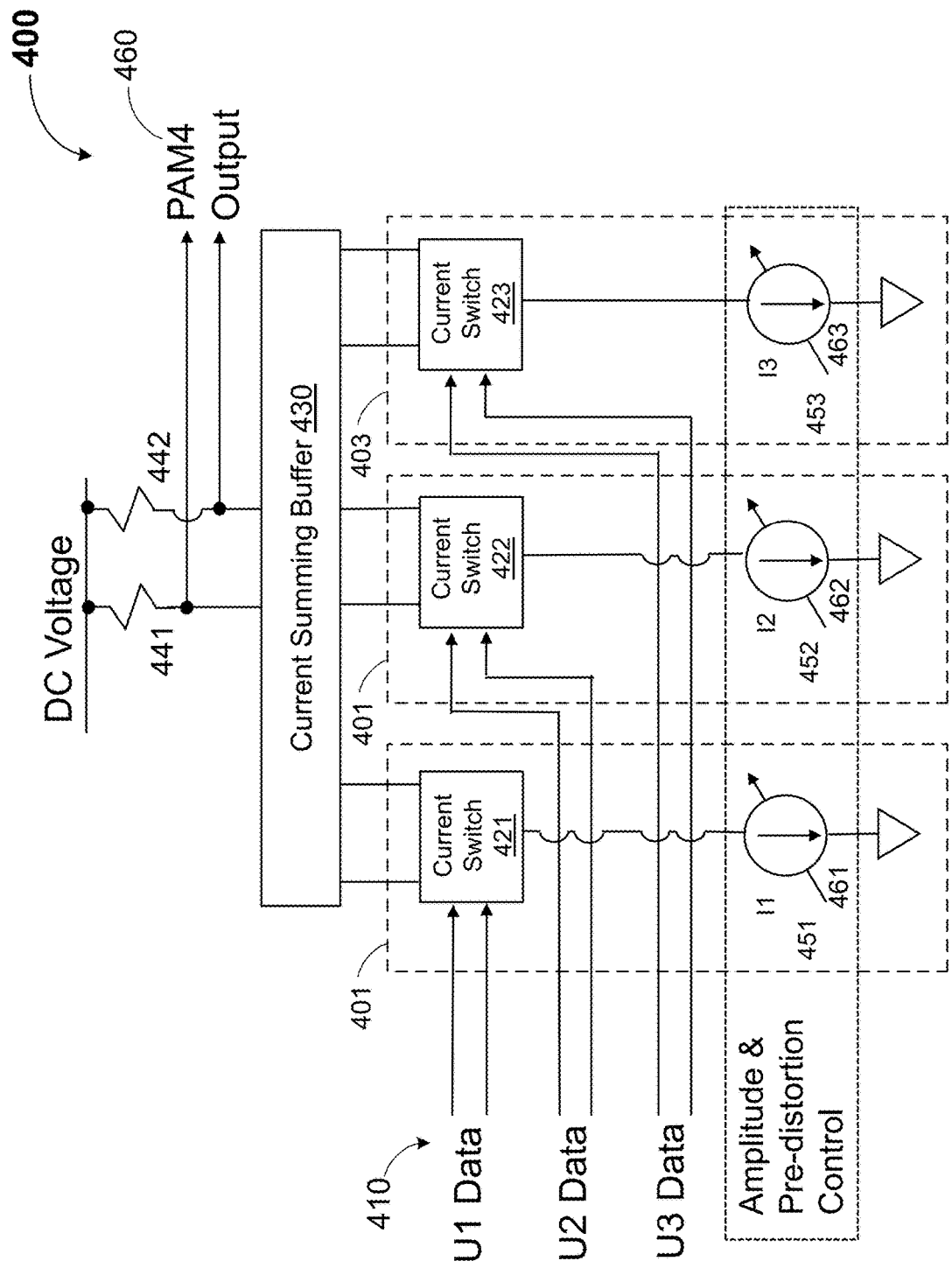
FIG. 4 illustrates a block diagram of an example of the Unary-to-PAM4 Encoding Driver shown in FIG. 2 according to an embodiment of the present invention.

FIG. 4 illustrates a block diagram of a Unary-to-PAM4 Encoding Driver according to an embodiment of the present invention. Unary-to-PAM4 Encoding Driver 400 in FIG. 4 is an example driver that can be used as Unary-to-PAM4 Encoding Driver 220 shown in FIG. 2. In FIG. 4, a first circuit 401 includes a first switch 421 and a first adjustable current source 451 and is configured to receive a first data bit of the thermometer code signal U1. A second circuit 402 includes a second switch 422 and a second adjustable current source 452 and is configured to receive a second data bit of the thermometer code signal U2. A third circuit 403 includes a third switch 423 and a third adjustable current source 453 and is configured to receive a third data bit of the thermometer code signal U3. The unary-to-PAM4 encoding driver also has a current summing buffer 430 coupled to the first circuit, the second circuit, and the third circuit. A load circuit, including resistors 441 and 442, is coupled to the current summing buffer 430 and is configured to provide an output voltage signal 460 based on a sum of current from each of the first, the second, and the third circuits. In some embodiments, the unary-to-PAM4 encoding driver also includes three current control signals 461, 462, and 463 for adjusting, respectively, the first adjustable current source, the second adjustable current source, and the third adjustable current source.

In FIG. 4, the inputs to Unary-to-PAM4 Encoding Driver 400 are essentially three NRZ (2-state) data signals labeled U1, U2, and U3 (410). Adjustable current sources I1, I2, and I3 provide currents for current switches 421, 422, and 423, which steer the current from one of two input current polarities (plus or minus) to a current summing buffer 430 based on the digital switching of signals U1, U2, and U3, respectively, which then sums and buffers the currents of the three current switches to two load resistors 441 and 442 (one for each polarity) connected to a DC supply voltage. The load resistors 441 and 442 are used to convert currents into PAM4 output voltages 460. Each of the currents I1, I2, and I3 are independently electrically adjustable. Through the switching action of the current switches on currents I1, I2, and I3 steering those currents to the load resistors based upon independent input data streams U1, U2, and U3, respectively, a 4-level PAM4 output waveform is generated, as illustrated in FIGS. 3A and 3B. Through the adjustment of current sources I1, I2, and I3 by adjustment control signals 461, 462, and 463, the PAM4 output signal is amplified and various pre-distortion characteristics can be generated with respect to the PAM4 output signal that will be illustrated later.

Figure 5:
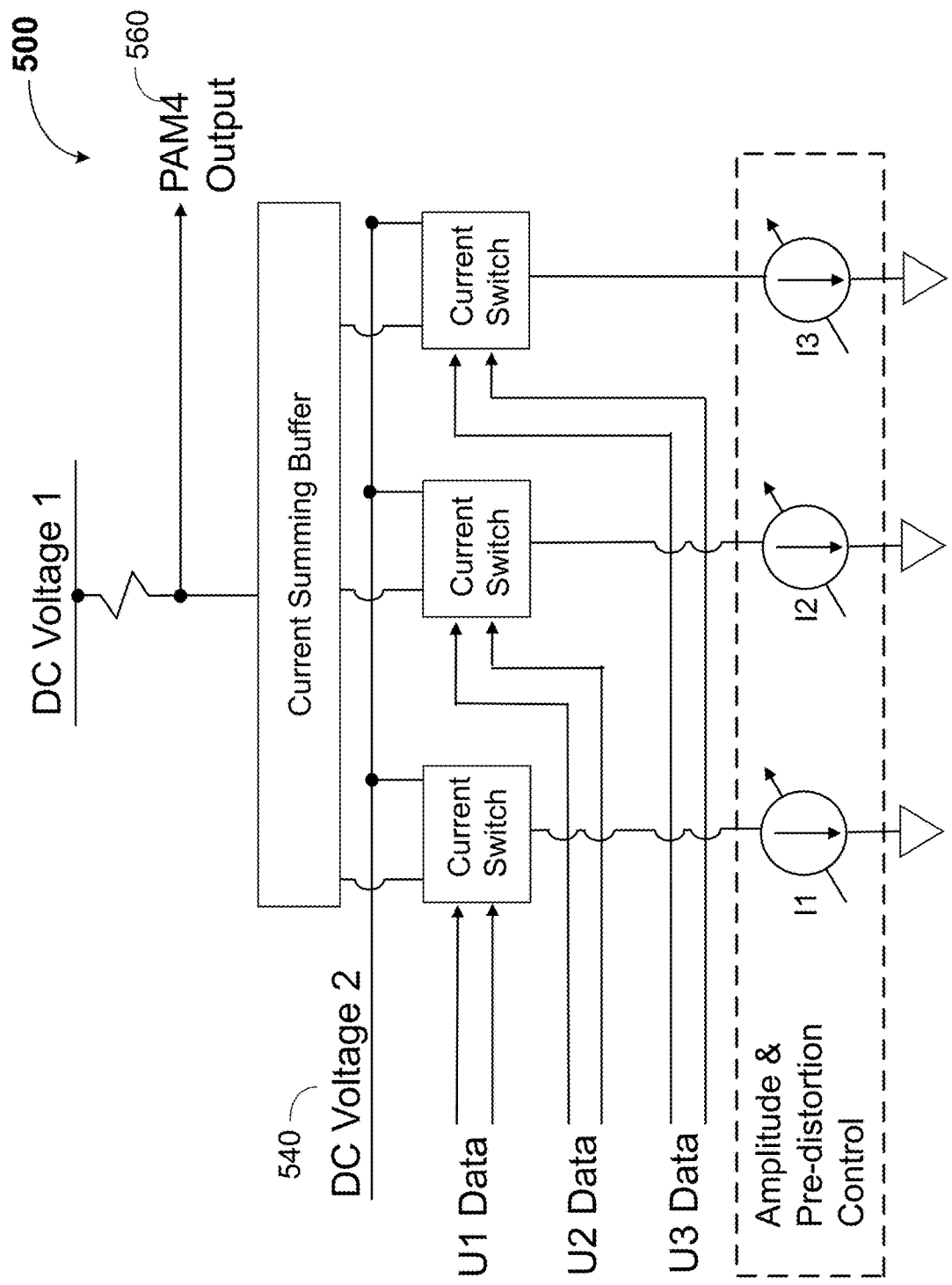
FIG. 5 illustrates a block diagram of a Unary-to-PAM4 Encoding Driver generating a single-ended PAM4 (4-state) output signal according to an embodiment of the present invention.

FIG. 5 illustrates a block diagram of a Unary-to-PAM4 Encoding Driver generating a single-ended PAM4 (4-state) output signal according to an embodiment of the present invention. This configuration is similar to the differential configuration previously described in FIG. 4, which provides differential output signal 460; only the differences will be described here. In this configuration, a second DC voltage, DC Voltage 2 (540), is used to source the current to the unused current switch output polarity for each of the current switches connected to I1, I2, and I3 respectively. These currents represent the "zero state" for U1, U2, and U3 input data signals. In the "one state" of U1, U2, and U3 data, currents I1, I2, and I3, respectively, are summed and buffered on the load resistor 542. The load resistor 542 forms a single-ended PAM4 output signal from these summed currents. One advantage of this topology for the generation of a single-ended PAM4 output signal is that DC Voltage 2 can be substantially lower than DC Voltage 1, resulting in lower power dissipation of this circuit.

Figure 6:
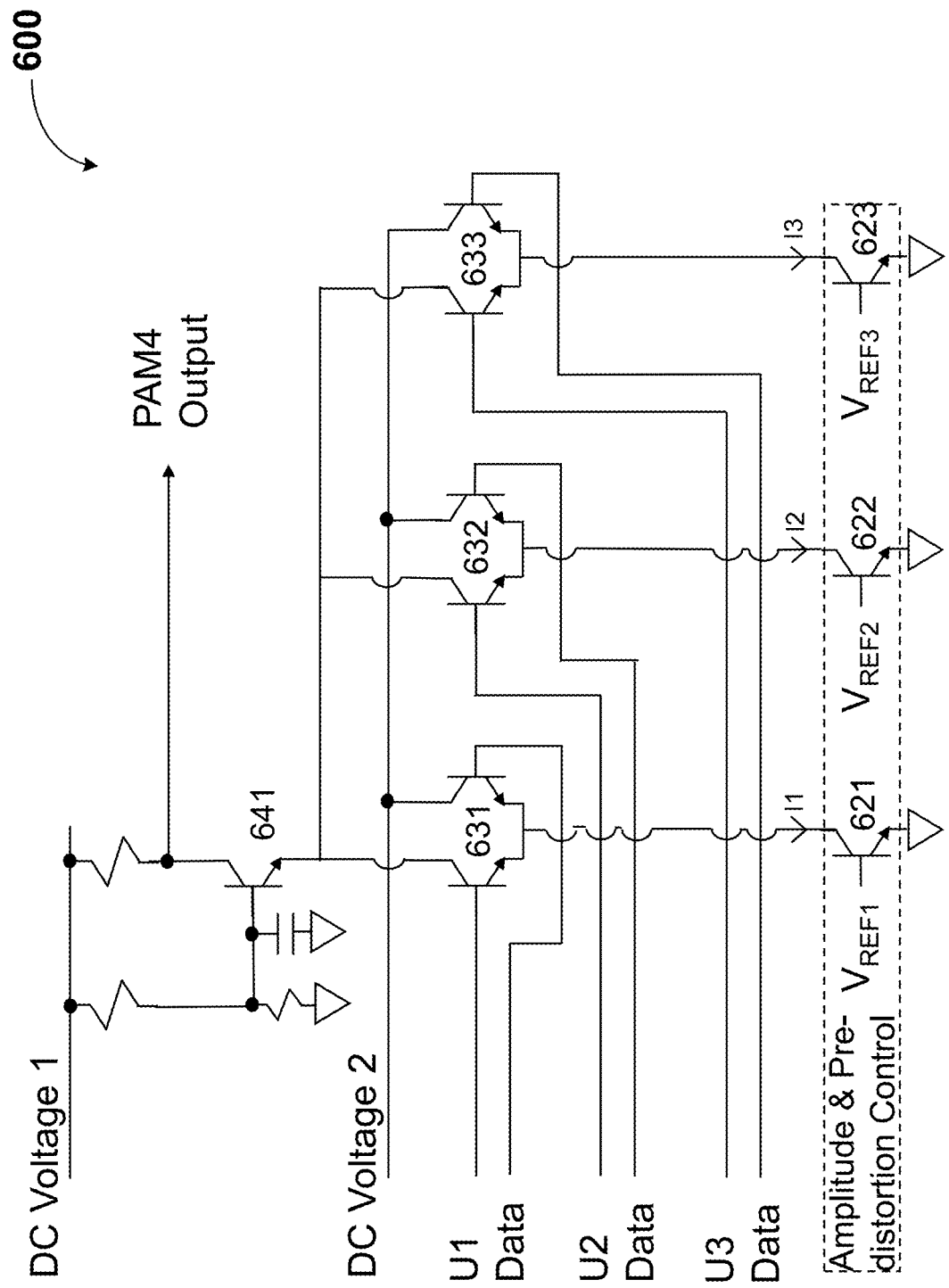
FIG. 6 illustrates a circuit diagram of the single-ended Encoding Driver according to an embodiment of the present invention.

FIG. 6 illustrates a circuit diagram of the single-ended Encoding Driver according to an embodiment of the present invention. In this configuration, the current sources are realized using an NPN transistor 621, 622, and 623 with adjustable reference voltages presented to the base terminal denoted by VREF1, VREF2, and VREF3 in the diagram. The current switches are realized using a common-emitter differential pair of NPN transistors 631, 632, and 633. The current summing buffer is realized using NPN transistors 641 in a common-base configuration, thus forming a cascode topology with the common-emitter NPN transistors of the current switches. Additionally, bias circuitry and bypass capacitance is provided for the base terminals of the common-base current summing buffer transistors.

FIGS. 7A-7D illustrate the pre-distortion characteristics that can be generated on the PAM4 output signal through the use of the Encoding Driver circuit configuration and through the setting of currents I1, I2, and I3 according to embodiments of the present invention described above. The upper left diagram FIG. 7A illustrates that a PAM4 eye can be generated with no pre-distortion (evenly spaced levels) through setting of current I1 equal to I2 equal to I3. The upper right diagram FIG. 7B illustrates a PAM4 eye with symmetrical pre-distortion through setting of current I1 equal to I3, and I2 to greater than I1. The lower left diagram FIG. 7C illustrates a PAM4 eye with symmetrical predistortion through setting of current I1 equal to I3, and I2 to less than I1. The lower right diagram FIG. 7D illustrates a PAM4 eye with asymmetrical pre-distortion through setting of current I1 to greater than I2 to greater than I3.

FIGS. 8A-8D illustrate simulation waveforms illustrating the pre-distortion character described above in connection with FIGS. 7A-7D according to an embodiment of the present invention.

The Encoding Driver circuit illustrated can be used as an output stage of a multi-stage driver IC (an example Pre-Driver stage will be illustrated later), or as a standalone driver IC with the addition of input termination resistors and input biasing circuitry not shown but well known to someone skilled in the art. Other permutations that fall within the present invention which can be accomplished by one skilled in the art include using the opposite input signal polarity on one or more input signals, using FET transistor or a combination to bipolar and FET transistors in the realization of the current switch, current source, or summing buffer functions, using the same power supply for DC Voltage 1 and 2, using a DAC controlled circuit for generation of VREF1-3, using additional current switch stages and reference currents in summation on the common load resistor, using any combination of fixed or variable current sources, to use an active load instead of a load resistor, using a remote load resistor at an optical modulator or at a direct modulated laser diode, or using any combination of positive, negative, and ground potentials to bias the driver, etc.

Figure 9:
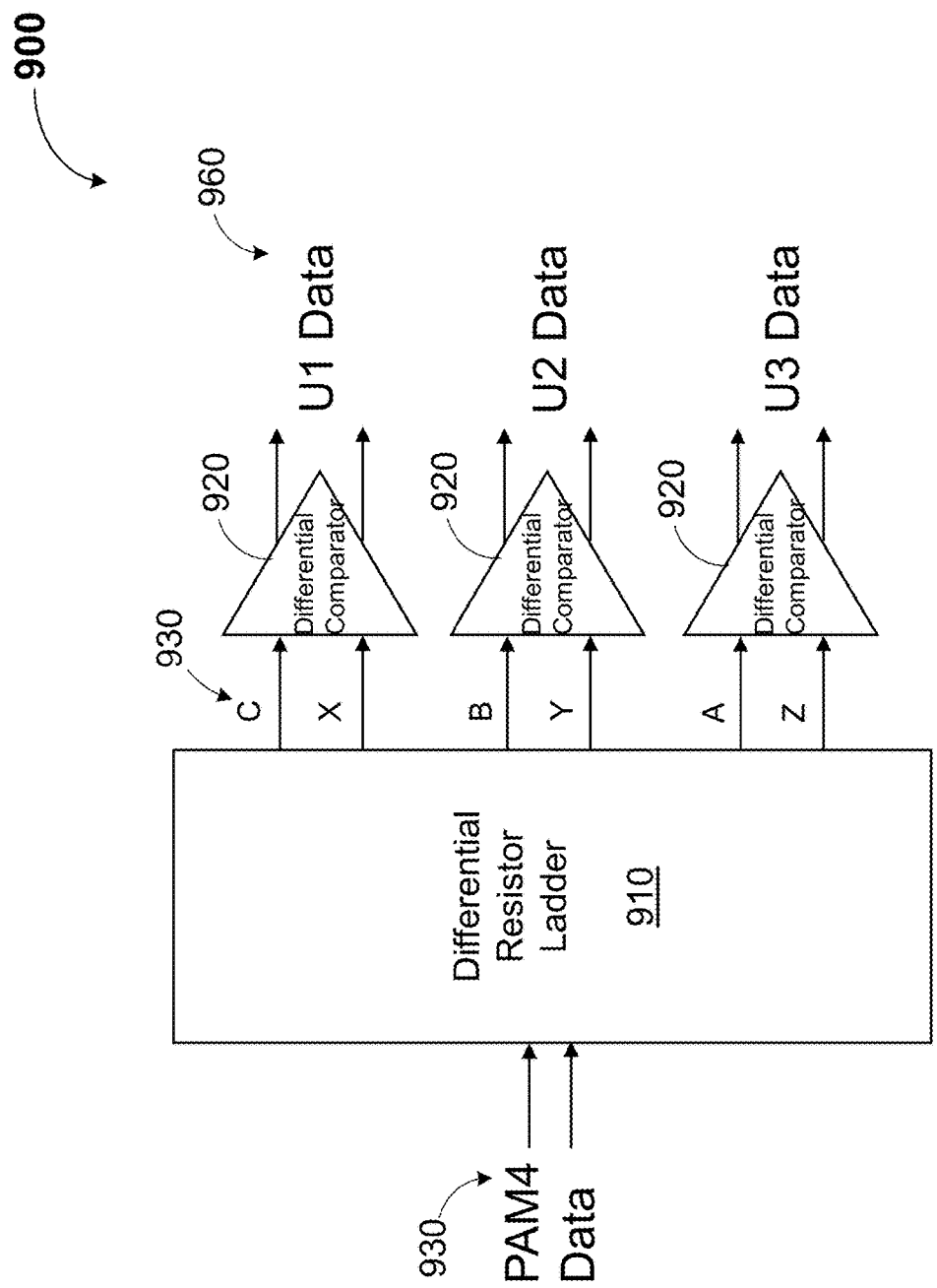
FIG. 9 illustrates a block diagram of a PAM4-to-Unary Decoder in FIG. 2 according to an embodiment of the present invention.

FIG. 9 illustrates a block diagram of a PAM4-to-Unary Decoder according to an embodiment of the present invention. As shown in FIG. 9, PAM4-to-Unary Decoder 900 is an example circuit that can be used as PAM4-to-Unary Decoder 210 in FIG. 2. PAM4-to-Unary Decoder 900 includes a differential resistor ladder 910 and multiple differential comparators 920. The PAM4 (4-state) input data waveform 920 is decoded into three unary NRZ (2-state) waveforms via thermometer coding using a differential resistor ladder 910, which generates 6 outputs C, X, B, Y, A, and Z (3-levels for each polarity) 930, followed by 3 differential comparators 920, which generates three limiting NRZ thermometer output waveforms 960 including U1, U2, and U3.

Figure 10:
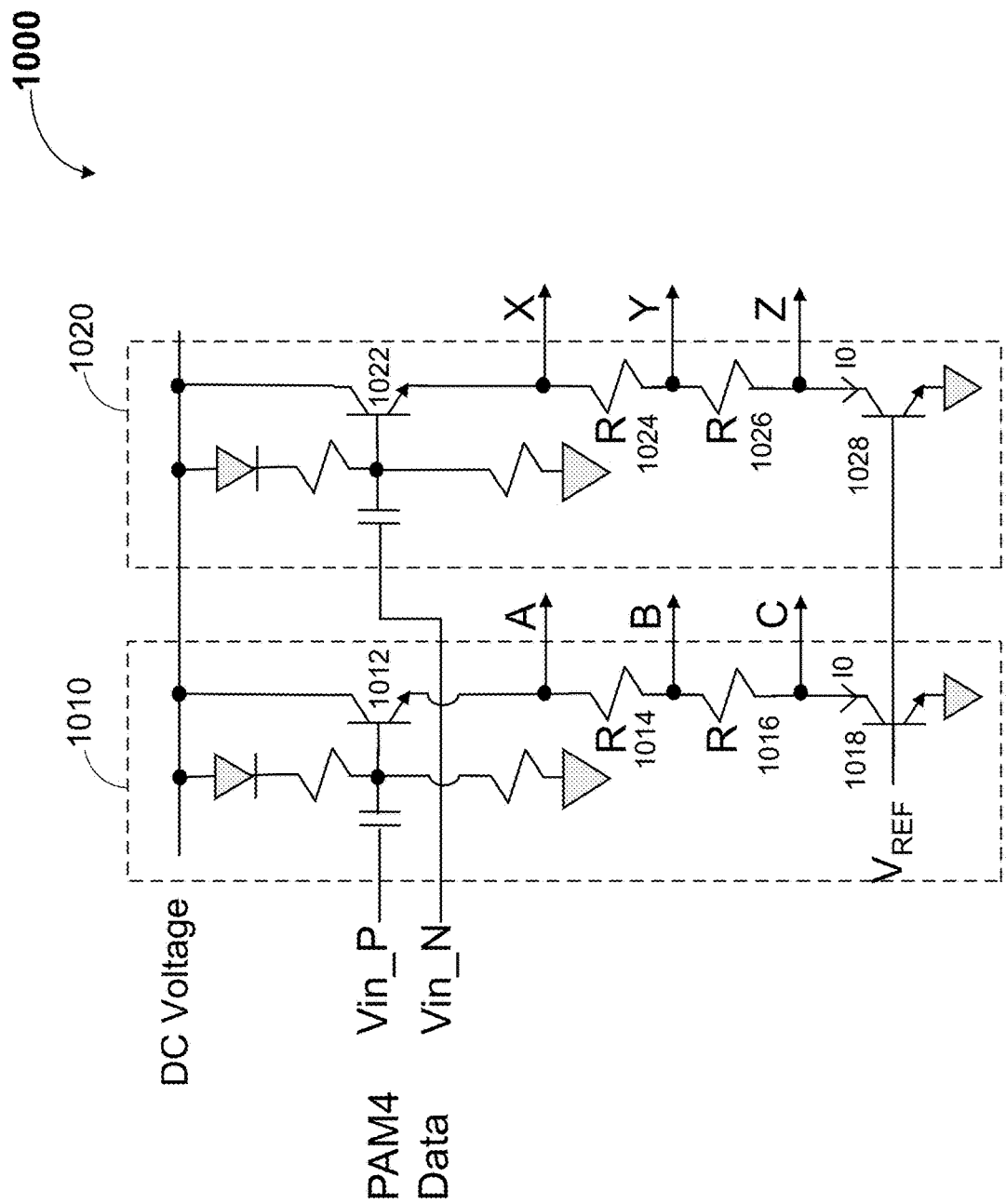
FIG. 10 is a circuit diagram illustrating one implementation of the differential resistor ladder in FIG. 9 according to an embodiment of the present invention.

FIG. 10 illustrates one implementation of the differential resistor ladder according to an embodiment of the present invention. As shown in FIG. 10, differential resistor ladder 1000 is an example of differential resistor ladder 910 of FIG. 9. In the embodiment of FIG. 10, differential resistor ladder circuit 1000 includes a first resistor ladder 1010 and a second resistor ladder 1020. The first resistor ladder 1010 is configured for receiving a first differential PAM4 signal, e. g., Vin_P, and includes a first transistor 1012, a first resistor 1014, a second resistor 1016, and a first current source 1018 coupled in series at, respectively, three internal nodes and configured to provide a first group of three voltage signals, A, B, and C. The second resistor ladder 1020 is configured for receiving a second differential PAM4 signal, e.g., Vin_N, and includes a second transistor 1022, a third resistor 1024, a fourth resistor 1026, and a second current source 1028 coupled in series at, respectively, three internal nodes and configured to provide a second group of three voltage signals X, Y, and Z.

In the embodiment of FIG. 10, current sources 1018 and 1028 are fixed current sources supplying a current I0, realized using NPN transistors with an adjustable reference voltage presented to the base terminal denoted by VREF. Resistor ladders having resistors 1014, 1016, 1024 and 1028 with resistance values R set up fixed static DC voltage offsets of I0*R for nodes A and B, B and C, as well as nodes X and Y, Y and Z when no input signal is applied. When a PAM4 input waveform is applied, Vin_P is buffered through the emitter follower 1012 and the voltages on nodes A, B, and C all get a delta-voltage value equal to Vin_P. Similarly, the nodes X, Y, Z get a delta-voltage value equal to Vin_N since both current source I0 and resistor values R are fixed, and both are independent of input voltage Vin. The comparators 920 in FIG. 9 then are wired such that the I0*R offsets create the proper positive or negative offsets for the correct comparator thresholds for generating U1, U2, and U3 comparator outputs based on the fixed amplitude differential PAM4 input signal waveform as shown in the previous figure. The currents I0 can be generated to be dependent on sheet resistance value such that I0*R is a constant voltage value.

Figure 11:
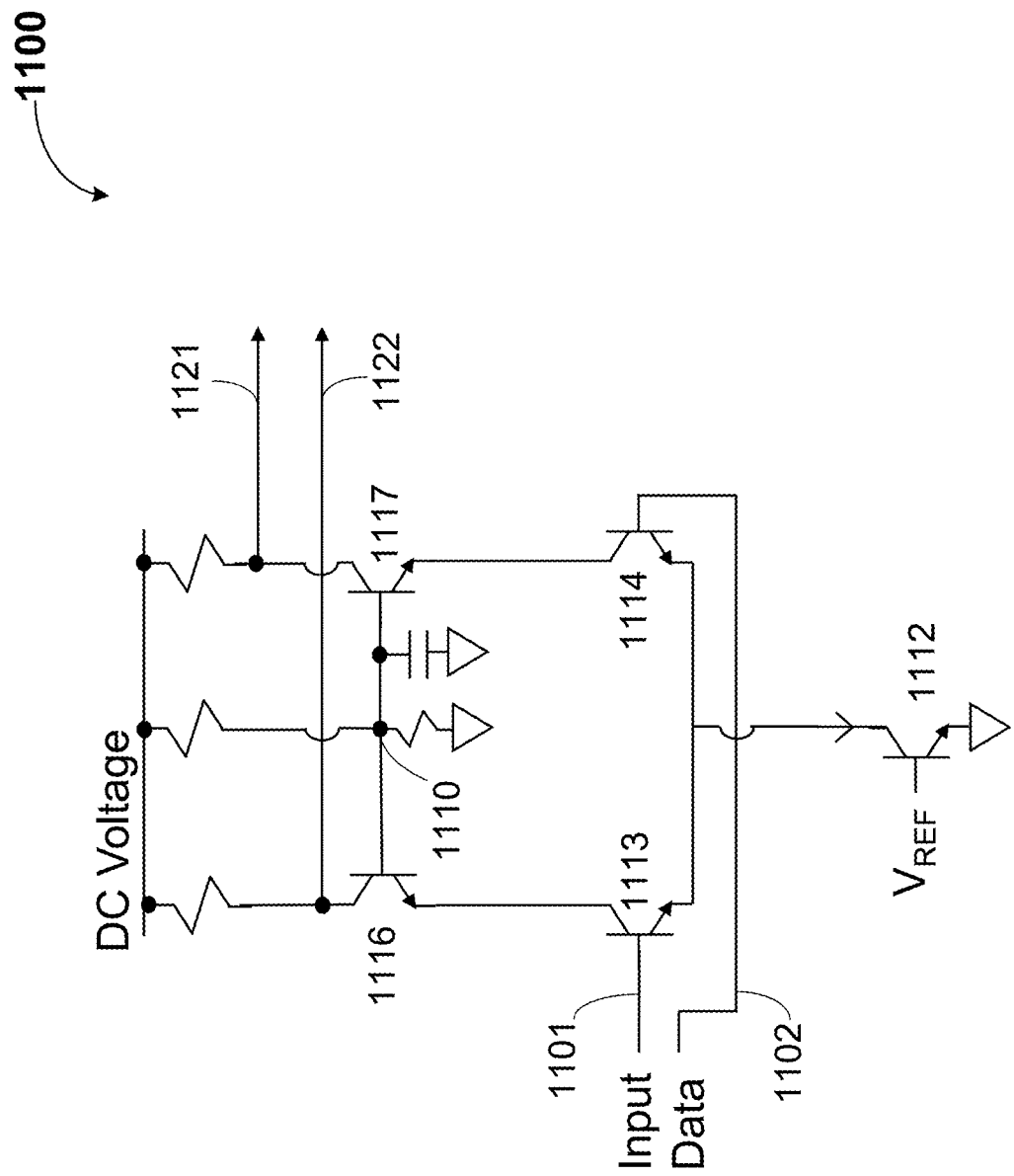
FIG. 11 is a circuit diagram illustrating one implementation of the differential comparator in FIG. 9 according to an embodiment of the present invention.

FIG. 11 illustrates one implementation of the differential comparator according to an embodiment of the present invention. Differential comparator 1100 in FIG. 11 is an example of one of the differential comparators 920 of FIG. 9. As shown in FIG. 11, differential comparator 1100 is configured to receive first and second input signals 1101 and 1102 and to compare the voltage levels of the first signal and the second signal to provide differential output signals 1121 and 1122 representing one of three data bits of the thermometer code signal. As shown in FIG. 9, each differential comparator 920 has two input terminals for coupling to receive two signals from differential resistor ladder 910. A first signal is selected from one of the first group of three voltage signals A, B, and C from the differential resistor ladder as shown in FIG. 10, and a second signal is selected from one of the second group of three voltage signals X, Y, and Z as shown in FIG. 10. As shown in FIG. 9, a first differential comparator 920 receives signals C and X, a second differential comparator 920 receives signals B and Y, and a third differential comparator 920 receives signals A and Z.

In the embodiment of FIG. 11, the current source 1112 is realized using an NPN transistor with an adjustable reference voltage presented to the base terminal denoted by VREF in the diagram. The comparing function is realized using a common-emitter differential pair of NPN transistors 1113 and 1114 followed by common-base NPN transistors 1116 and 1117, thus forming a cascode topology with the common-emitter transistors 1113 and 1114 of the differential pair. Additionally, bias circuitry and bypass capacitance is provided for the base terminals of the common-base transistors.

The decoder circuit illustrated can be used as an input stage of a multi-stage driver IC (an example Driver stage was illustrated earlier), or as a standalone driver IC. Other permutations that fall within the present invention which can be accomplished by one skilled in the art include to use a single-ended resistor ladder, to use FET transistor or a combination to bipolar and FET transistors in the realization of the follower, ladder, current source, and differential pair, to use a DAC controlled circuit for generation of VREF, to use any combination of fixed or variable current sources, to use an active load instead of a load resistor, or to use any combination of positive, negative, and ground potentials to bias the driver, etc.

Further, the description of the decoder circuit in connection to FIGS. 9-11 are not limited to PMA input signals or unary or binary output signals. For example, according to some embodiments of the present invention, a decoder is provided for converting a multi-level signal to digital signal. Each digital signal has a number of data bits, and each data bit represent one of two data values. The multi-level signal to digital signal decoder includes a resistor ladder circuit to receive the multi-level signal and to provide multiple internal signals. The multi-level signal to digital signal decoder also includes a plurality of comparators coupled to the resistor ladder circuit to receive the multiple internal signals, and configured to provide the digital signal. In some embodiments, the resistor ladder circuit can include a first transistor, a number of resistors, and a first current source coupled in series at, respectively, multiple internal nodes and configured to provide multiple voltage signals. For example, the multi-level signal may include N signal levels, where N is an integer. The first transistor is configured to receive the multi-level input signal. The resistor ladder circuit includes N−2 resistors and N−1 internal nodes for providing N−1 voltage signals.

It is understood that the examples and embodiments described herein are for illustrative purposes only, and not as a limitation in the scope of the present invention in any way. Various modifications or changes in light thereof will be suggested to persons skilled in the art without departing from the spirit of the present invention. Some of the modifications can include, for example, but are not limited to, the use of FET, CMOS, BiCMOS, or Bipolar transistors in the circuit diagrams shown, the use of single-ended signals instead of the differential signals shown, or the use of binary decoding/encoding instead of the unary decoding/encoding shown.

What is claimed is:

1. A PAM4 (Pulse Amplitude Modulation-4) modulator driver circuit, comprising:

a PAM4-to-unary decoder configured to receive a PAM4 data signal and to convert the PAM4 data signal to a thermometer code signal, the thermometer code signal including three data bits; and a unary-to-PAM4 encoding driver coupled to the PAM4-to-unary decoder to receive the thermometer code signal, and to convert the thermometer code signal to a PAM4 output signal having four output amplitude levels;

wherein the unary-to-PAM4 encoding driver includes three variable current sources and is configured to electrically adjust the output amplitude levels in the PAM4 output signal;

whereby the unary-to-PAM4 encoding driver is configured to amplify the PAM4 output signal and to generate pre-distortion characteristics with respect to the PAM4 output signal.

2. The circuit of claim 1, wherein the unary-to-PAM4 encoding driver comprises:

a first circuit including a first switch and a first adjustable current source and configured to receive a first data bit of the thermometer code signal;

a second circuit including a second switch and a second adjustable current source and configured to receive a second data bit of the thermometer code signal;

a third circuit including a third switch and a third adjustable current source and configured to receive a third data bit of the thermometer code signal;

a current summing buffer coupled to the first circuit, the second circuit, and the third circuit; and a load circuit coupled to the current summing buffer and configured to provide an output signal based on a sum of current from each of the first, the second, and the third circuits.

3. The circuit of claim 2, further comprising three current control signals for adjusting, respectively, the first adjustable current source, the second adjustable current source, and the third adjustable current source.

4. The circuit of claim 1, wherein the PAM4 data signal comprises two differential PAM4 data signals.

5. The circuit of claim 4, wherein the PAM4-to-unary decoder comprises:

a differential resistor ladder circuit to receive the two differential PAM4 data signals and to provide multiple internal signals; and three differential comparators coupled to the differential resistor ladder circuit to receive the multiple internal signals, and the three differential comparators configured to provide the thermometer code signal.

6. The circuit of claim 5, wherein the differential resistor ladder circuit comprises:

a first resistor ladder for receiving a first differential PAM4 signal, the first resistor ladder including a first transistor, a first resistor, a second resistor, and a first current source coupled in series at, respectively, three internal nodes and configured to provide a first group of three voltage signals;

a second resistor ladder for receiving a second differential PAM4 signal, the second resistor ladder including a second transistor, a third resistor, a fourth resistor, and a second current source coupled in series at, respectively, three internal nodes and configured to provide a second group of three voltage signals.

7. The circuit of claim 6, wherein each of the three differential comparators comprises two input terminals configured to receive:

a first signal from one of the first group of three voltage signals of the first resistor ladder; and a second signal from one of the second group of three voltage signals of the second resistor ladder;

wherein each differential comparator is configured to compare the first signal and the second signal to provide differential output signals representing one of three data bits of the thermometer code signal.

8. The circuit of claim 1, wherein the PAM4 output signal is a differential signal.

9. The circuit of claim 1, wherein PAM4 output signal is a single ended signal.

10. A PAM (Pulse Amplitude Modulation) modulator driver circuit, comprising:

a PAM-to-unary decoder configured to receive a PAM input signal and convert the PAM input signal to a unary code signal; and a unary-to-PAM encoding driver coupled to the PAM-to-unary decoder to receive the unary code signal from the PAM-to-unary decoder, and configured to convert the unary code signal to a PAM output signal having multiple amplitude levels;

wherein the PAM input signal comprises N amplitude levels, the unary code signal comprises N−1 data bits, and the PAM output signal comprises N amplitude levels, where N is an integer; and wherein the unary-to-PAM encoding driver comprises N−1 current sources, each of the current sources being controlled by one of the data bits in the unary code signal;

whereby the unary-to-PAM encoding driver is configured to amplify the PAM output signal and to generate pre-distortion characteristics with respect to the PAM output signal.

11. The circuit of claim 10, wherein the PAM modulator driver circuit is configured to electrically adjust the multiple amplitude levels in the PAM output signal.

12. The circuit of claim 10, wherein N=8.

13. The circuit of claim 12, wherein the N−1 current sources are adjustable current sources configured to provide current levels adjustable by a respective control signal, the adjustable current sources being configured to electrically adjust amplitude levels in the PAM output signal.

14. The circuit of claim 10, wherein the PAM modulator driver circuit is a PAM4 (Pulse Amplitude Modulation-4) modulator driver circuit, the PAM4 modulator driver circuit comprising:

a PAM4-to-unary decoder configured to receive a PAM4 data signal and to convert the PAM4 data signal to a thermometer code signal, the thermometer code signal including three data bits; and a unary-to-PAM4 encoding driver coupled to the PAM4-to-unary decoder to receive the thermometer code signal, and to convert the thermometer code signal to a PAM4 output signal;

wherein the unary-to-PAM4 encoding driver includes three variable current sources and is configured to provide electrically adjustable signal levels in the PAM4 output signal.

15. A method for a PAM (Pulse Amplitude Modulation) modulator driver, comprising:

receiving a PAM input signal having N input amplitude levels, where N is an integer; and providing a PAM output signal having N output amplitude levels based on the PAM input signal, wherein the PAM modulator driver comprises:

a PAM-to-unary decoder configured to receive the PAM input signal and to convert the PAM input signal to a thermometer code signal, the thermometer code signal including N−1 data bits; and a unary-to-PAM encoding driver coupled to the PAM-to-unary decoder to receive the thermometer code signal, and to convert the thermometer code signal to a PAM output signal having N output amplitude levels;

wherein the unary-to-PAM encoding driver includes N−1 variable current sources and is configured to electrically adjust the output amplitude levels in the PAM output signal;

whereby the unary-to-PAM encoding driver is configured to amplify the PAM output signal and to generate pre-distortion characteristics with respect to the PAM output signal.

16. The method of claim 15, wherein $N=2^K$, where K is an integer.

17. The method of claim 15, wherein N=4 and the unary-to-PAM encoding driver is a unary-to-PAM4 encoding driver comprising:

a first circuit including a first switch and a first adjustable current source and configured to receive a first data bit of the thermometer code signal;

a second circuit including a second switch and a second adjustable current source and configured to receive a second data bit of the thermometer code signal;

a third circuit including a third switch and a third adjustable current source and configured to receive a third data bit of the thermometer code signal;

a current summing buffer coupled to the first circuit, the second circuit, and the third circuit; and a load circuit coupled to the current summing buffer and configured to provide an output signal based on a sum of current from each of the first, the second, and the third circuits.

18. The method of claim 17, wherein the PAM modulator driver further comprises three current control signals for adjusting, respectively, the first adjustable current source, the second adjustable current source, and the third adjustable current source.

19. The method of claim 15, wherein the PAM input signal comprises a differential signal.

20. The method of claim 19, wherein N=4 and the PAM-to-unary decoder is a PAM4-to-unary decoder comprising:

a differential resistor ladder circuit to receive two differential PAM4 input signals and to provide multiple internal signals; and three differential comparators coupled to the differential resistor ladder circuit to receive the multiple internal signals, and the three differential comparators configured to provide the thermometer code signal.

* * * * *